(12) United States Patent
Lin et al.

(10) Patent No.: US 11,637,200 B2
(45) Date of Patent: *Apr. 25, 2023

(54) POWER SEMICONDUCTOR DEVICE

(71) Applicant: UNITED MICROELECTRONICS CORP., Hsinchu (TW)

(72) Inventors: Zong-Han Lin, Tainan (TW); Yi-Han Ye, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 45 days.

This patent is subject to a terminal disclaimer.

(21) Appl. No.: 17/378,820

(22) Filed: Jul. 19, 2021

(65) Prior Publication Data

US 2022/0077313 A1 Mar. 10, 2022

Related U.S. Application Data

(63) Continuation of application No. 17/072,064, filed on Oct. 16, 2020, now Pat. No. 11,101,384.

(30) Foreign Application Priority Data

Sep. 7, 2020 (CN) .......................... 202010927143.2

(51) Int. Cl.
*H01L 29/78* (2006.01)
*H01L 29/66* (2006.01)
*H01L 29/423* (2006.01)
*H01L 29/06* (2006.01)

(52) U.S. Cl.
CPC ...... *H01L 29/7817* (2013.01); *H01L 29/0684* (2013.01); *H01L 29/42372* (2013.01); *H01L 29/66681* (2013.01); *H01L 29/66484* (2013.01); *H01L 29/66545* (2013.01)

(58) Field of Classification Search
CPC ............. H01L 29/0653; H01L 29/0684; H01L 29/66659; H01L 29/66681; H01L 29/7835
See application file for complete search history.

(56) References Cited

U.S. PATENT DOCUMENTS

| | | | |
|---|---|---|---|
| 5,731,627 A | 3/1998 | Seok | |
| 6,927,453 B2 | 8/2005 | Shibib et al. | |
| 7,368,785 B2 | 5/2008 | Chen et al. | |
| 7,405,443 B1 * | 7/2008 | Zuniga | H01L 29/402 257/E29.264 |
| 7,521,759 B2 | 4/2009 | Sasaki | |

(Continued)

*Primary Examiner* — Raj R Gupta
(74) *Attorney, Agent, or Firm* — WPAT, PC

(57) ABSTRACT

A power semiconductor device includes a substrate, a first well, a second well, a drain, a source, a first gate structure, a second gate structure and a doping region. The first well has a first conductivity and extends into the substrate from a substrate surface. The second well has a second conductivity and extends into the substrate from the substrate surface. The drain has the first conductivity and is disposed in the first well. The source has the first conductivity and is disposed in the second well. The first gate structure is disposed on the substrate surface and at least partially overlapping with the first well and second well. The second gate structure is disposed on the substrate surface and overlapping with the second well. The doping region has the first conductivity, is disposed in the second well and connects the first gate structure with the second gate structure.

9 Claims, 7 Drawing Sheets

(56) References Cited

U.S. PATENT DOCUMENTS

| | | | |
|---|---|---|---|
| 7,560,324 B2 | 7/2009 | Chidambaram | |
| 7,719,064 B2 | 5/2010 | Wu et al. | |
| 7,728,388 B1 | 6/2010 | Tsai | |
| 7,824,968 B2 | 11/2010 | Chu et al. | |
| 8,115,253 B2* | 2/2012 | Tang | H01L 29/7816 257/341 |
| 8,507,987 B2 | 8/2013 | Huang et al. | |
| 8,610,206 B2 | 12/2013 | Chu et al. | |
| 8,643,101 B2 | 2/2014 | Kao et al. | |
| 8,692,326 B2 | 4/2014 | Lee et al. | |
| 8,921,937 B2 | 12/2014 | Wang et al. | |
| 9,553,188 B1 | 1/2017 | Li et al. | |
| 10,573,743 B2* | 2/2020 | Shinohara | H01L 29/7816 |
| 11,101,384 B1* | 8/2021 | Lin | H01L 29/7817 |
| 2012/0187485 A1* | 7/2012 | Morioka | H01L 29/1045 257/E29.256 |

* cited by examiner

POWER SEMICONDUCTOR DEVICE

This application is a continuation application of U.S. application Ser. No. 17/072,064, filed on Oct. 16, 2020, which claims the benefit of People's Republic of China application Serial No. 202010927143.2, filed on Sep. 7, 2020, the subject matter of which is incorporated herein by reference.

BACKGROUND

Technical Field

The disclosure relates to a semiconductor device, and more particularly to a power semiconductor device.

Description of Background

A power semiconductor device, such as a metal-oxide-semiconductor field-effect transistor (MOSFET), is a power control component of an electronic information product. Since it has characteristics of large on-current, low on-resistance, high switching speed and high-voltage current resistance, thus is mainly used in the switching power control systems for computers, mobile phones and portable products.

In order to satisfy the requirements of higher voltage operation, the conventional method is to extend the gate length (Lg) of the MOSFET to prevent current leakage (punch through) caused by hot carriers' injection (HCI). However, considering the limitations of element size (design rule) and its process technology (for example, the limitation of a chemical-mechanical planarization (CMP) technology), the gate length of the MOSFET cannot be excessively extended. Therefore, how to improve the operating voltage and the reliability of the MOSFET without excessively extending the gate length thereof has become one of the important issues in the pertinent technical field.

Therefore, there is a need of providing an improved power semiconductor device to solve the problems faced by the prior art.

SUMMARY

One aspect of the present disclosure is to provide a power semiconductor device, wherein the power semiconductor device includes a substrate, a first well, a second well, a drain, a source, a first gate structure, a second gate structure and a doping region. The first well has a first conductivity and extends into the substrate from a substrate surface. The second well has a second conductivity and extends into the substrate from the substrate surface. The drain has the first conductivity and is disposed in the first well. The source has the first conductivity and is disposed in the second well. The first gate structure is disposed on the substrate surface and at least partially overlapping with the first well and second well. The second gate structure is disposed on the substrate surface and overlapping with the second well. The doping region has the first conductivity, is disposed in the second well and connects the first gate structure with the second gate structure.

In accordance with the embodiments of the present disclosure, a power semiconductor device including at least two MOSFET devices is provided, in which a first gate structure and a second gate structure separated from each other are formed between the source and the drain and electrically connected together by a doping region. Wherein the doping region has a conductivity identical to that of the source and drain, so that the first gate structure, the source and drain are combined to form a first transistor unit; and the second gate structure, the doping region and the drain are combined to form a second transistor unit, which is connected in series with the first transistor unit. With this design, the operating voltage and reliability of the power semiconductor device can be improved without excessively extending the gate length of the first gate structure and the second gate structure.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
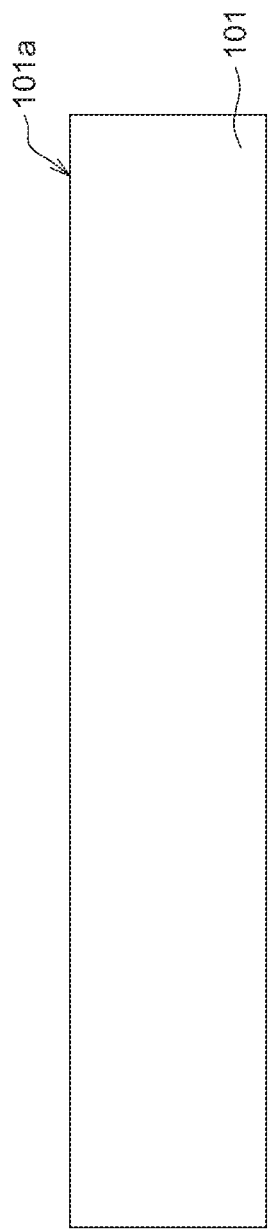
FIGS. 1A to 1E are cross-sectional views illustrating a series of the processing structures for fabricating a power semiconductor device according to an embodiment of the present disclosure.

The embodiments as illustrated below provide a power semiconductor device, which can improve the operating voltage and the reliability of the power semiconductor device without excessively extending the gate length of the MOSFET involved in the power semiconductor device. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIGS. 1A to 1E are cross-sectional views illustrating a series of the processing structure for fabricating a power semiconductor device 100 according to an embodiment of the present disclosure. The method for fabricating the power semiconductor device 100 includes steps as follows: Firstly, a substrate 101 is provided. In some embodiments of the present disclosure, the e substrate 101 may be a board, a chip, a wafer, a plate, a sheet or any type of films made of semiconductor materials, such as silicon (Si), germanium (Ge), or compound semiconductor materials, such as gallium arsenide (GaAs). In some other embodiments, the substrate 101 can be a silicon-on-insulator (SOI) substrate. In the present embodiment, the substrate 101 is a silicon substrate, such as a silicon chip (as shown in FIG. 1A).

Figure 1B:
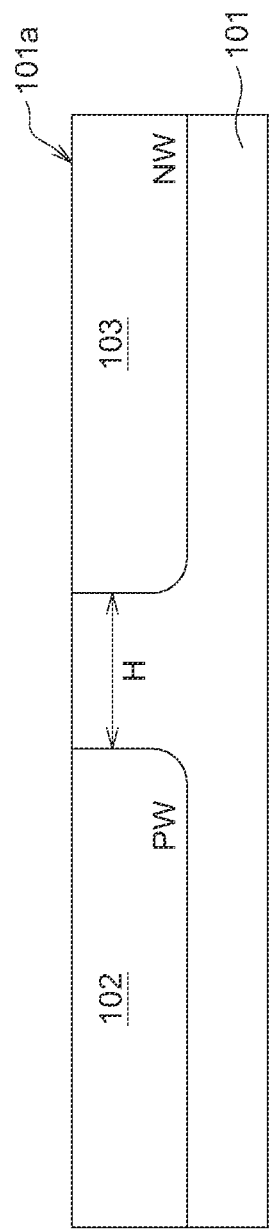

Next, at least one ion implantation process is performed on the surface 101a of the substrate 101 to form at least one p-type well region 102 and at least one n-type well region 103 in the substrate 101. In some embodiments of the present disclosure, the p-type well region 102 (also referred as to PW) and the n-type well region 103 (also referred as to NW) both extend into the substrate 101 from the surface 101a of the substrate 101. Among them, the n-type well region 103 and the p-type well region 102 are adjacent but isolated from each other. In the present embodiment, the substrate 101 has p-type conductivity; the p-type well region 102 and the n-type well region 103 have a doping concentration greater than that of the substrate 101, and these two are mutually isolated by a part of the substrate 101. The p-type well region 102 is separated from the n-type well region 103 for a distance H (as shown in FIG. 1B).

However, the configuration of the n-type well region 103 and the p-type well region 102 is not limited thereto. For example, in another embodiment of the present disclosure, the n-type well region 103 and the p-type well region 102 are not isolated from each other.

Then, a gate dielectric layer 104 and a conductive layer 105 are sequentially formed on the surface 101a of the substrate 101. In some embodiments of the present disclosure, the material constituting the dielectric layer 104 may be silicon dioxide ($SiO_2$), silicon nitride (SiN), silicon oxynitride (SiNO), high-k dielectric Materials (for example, hafnium oxide ($HfO_2$), aluminum oxide ($AlO_x$)) or a combination of the above dielectric materials. The conductive layer 105 may be poly-silicon, metal (for example, gold, silver, copper, aluminum, or tungsten), metal compound (for example, titanium nitride or tantalum nitride), or a combination thereof.

Figure 1C:
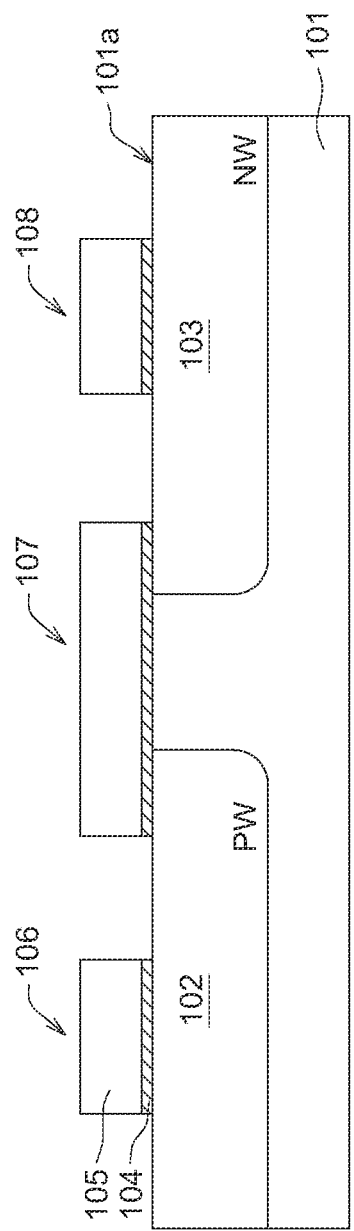

There in after, the gate dielectric layer 104 and the conductive layer 105 may be patterned by a photoresist etching process, thereby forming a plurality of gate structures (such as the gate structures 106 and 107), each of which includes a portion of the dielectric layer 104 and a portion of the conductive layer 105, on the surface 101a of the substrate 101. The gate structure 106 overlaps the p-type well region 102; the gate structure 107 at least partially overlaps the p-type well region 102 and the n-type well region 103, respectively. In other words, the gate structure 107 spans over the p-type well region 102 and the n-type well region 103, and overlaps the portion of the substrate 101 that is used to isolate the p-type well region 102 and the n-type well region 103 (as shown in FIG. 1C).

In some embodiments of the present disclosure, at least one dummy gate structure 108 including a portion of the dielectric layer 104 and a portion of the conductive layer 105 may be formed on the surface 101a of the substrate 101 by the step of patterning the dielectric layer 104 and the conductive layer 105. For example, in the present embodiment, the step of patterning the dielectric layer 104 and the conductive layer 105 further includes forming a dummy gate structure 108 overlapping with the n-type well region 103 and isolated from the gate structures 106 and 107. Wherein, the gate structure 107 is located between the gate structure 106 and the dummy gate structure 108.

Figure 1D:
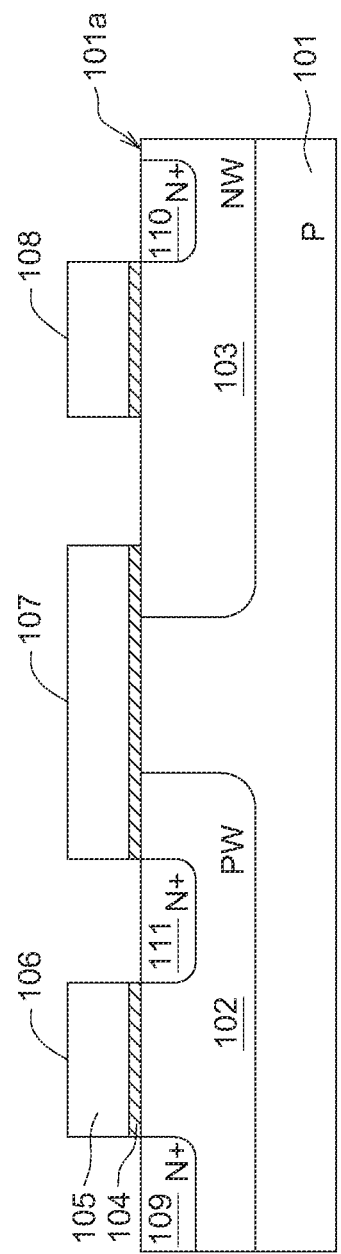

Subsequently, a source 109, a drain 110 and a doping region 111 with n-type conductivities are formed on the surface 101a of the device substrate 101 by at least one ion doping or epitaxial process, wherein the source 109 is disposed in the p-type well region 102 and adjacent to the gate structure 106; the drain 110 is disposed in the n-type well region 103 and adjacent to the dummy gate structure 108; the dummy gate structure 108 is disposed between the gate structure 107 and the drain 110; and the doping region 111 is disposed in the p-type well region 102, and connected to the gate structure 106 and the gate structure 107 (as shown in FIG. 1D). In some embodiments of the present disclosure, the doping concentrations of the source 109, the drain 110, and the doping region 111 are all greater than that of the p-type well region 102 and the n-type well region 103. Therefore, the source electrode 109, the drain 110 and the doping region 111 can be denoted as N+.

Among them, the gate structure 106, the source 109, the drain 110, the p-type well region 102, the n-type well region 103 and the substrate 101 can constitute a MOSFET unit 120. The gate structure 107, the doping region 111, the drain 110, the p-type well region 102, the n-type well region 103 and the substrate 101 can constitute another MOSFET unit 130, and these two MOSFET units 120 and 130 are connected in series with each other through the doping region 111.

Figure 1E:
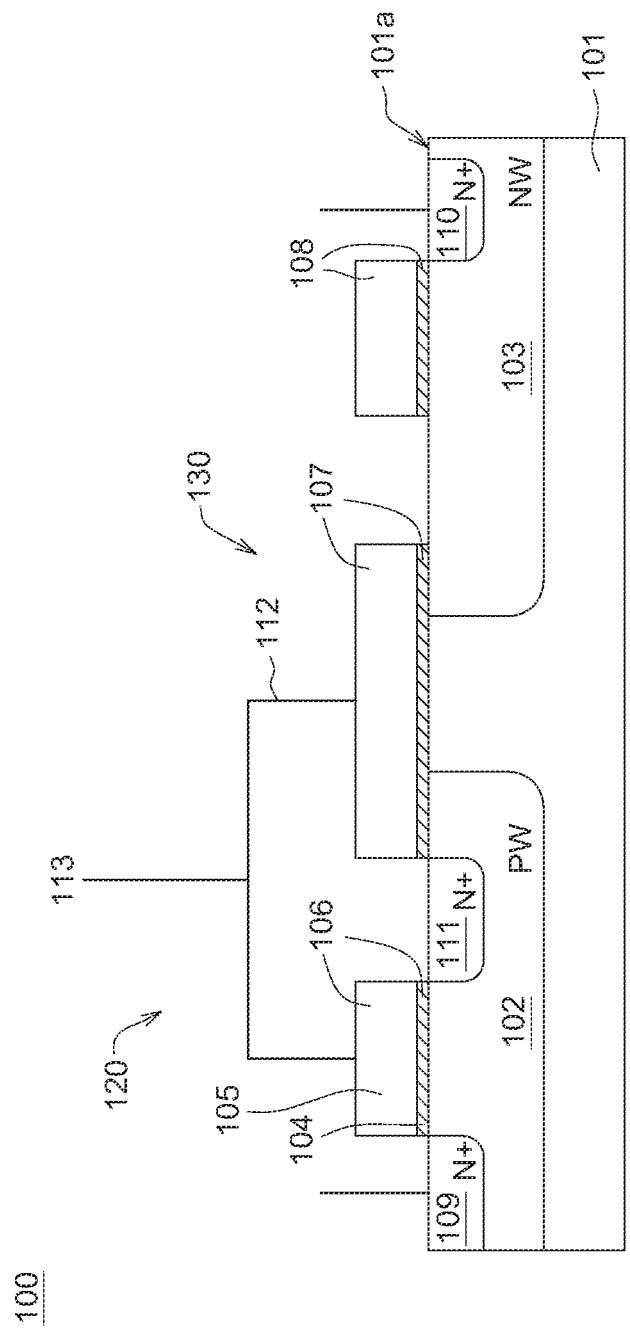

Subsequently, a downstream process, such as a metal damascene process, is performed to form a metal interconnection structure 112 on the surface 101a of the substrate 101, to make the dummy gate structure 108 floated, and to make the gate structure 106 and the gate structure 107 being connected to a common voltage source 113 to form the power semiconductor device 100 as shown in FIG. 1E.

The prepared power semiconductor device 100 includes: a substrate 101, a p-type well region 102, an n-type well region 103, a drain 110, a source 109, a gate structure 106, a gate structure 107, a dummy gate structure 108, and a doping region 111. The p-type well region 102 and the n-type well region 103 extend from the surface 101a of the substrate 101 into the substrate 101, and may (but not limited to) be isolated from each other. The source 109, the drain 110, and the doping region 111 all have n-type conductivities. The drain 110 is disposed in the n-well region 103; the source 109 is disposed in the p-type well region 102. The gate structure 107 is disposed on the surface 101a of the substrate 101 and at least partially overlaps the p-type well region 102 and the n-type well region 103. The gate structure 106 is disposed on the surface 101a of the substrate 101 overlaps the p-type well region 102 and is isolated from the gate structure 107. The doping region 111 is disposed in the p-type well region 102 and connects to the gate structure 106 and the gate structure 107. The dummy gate structure 108 is disposed on the surface 101a of the substrate 101, overlaps the n-type well region 103, and is disposed between the gate structure 107 and the drain 110.

However, it should be appreciated that the structure of the power semiconductor device 100 may not be limited to this regard. For example, in some other embodiments of the present disclosure, the power semiconductor device 100 may include more virtual gate structures (not shown) having the same structure as the dummy gate structure 108, and are disposed between the gate structure 107 and the dummy gate structure 108. In yet other embodiments of the present specification, the power semiconductor device 100 may include more gate structures having the same structure as the gate structure 106, which are arranged between the gate structure 107 and the gate structure 106.

Figure 2:
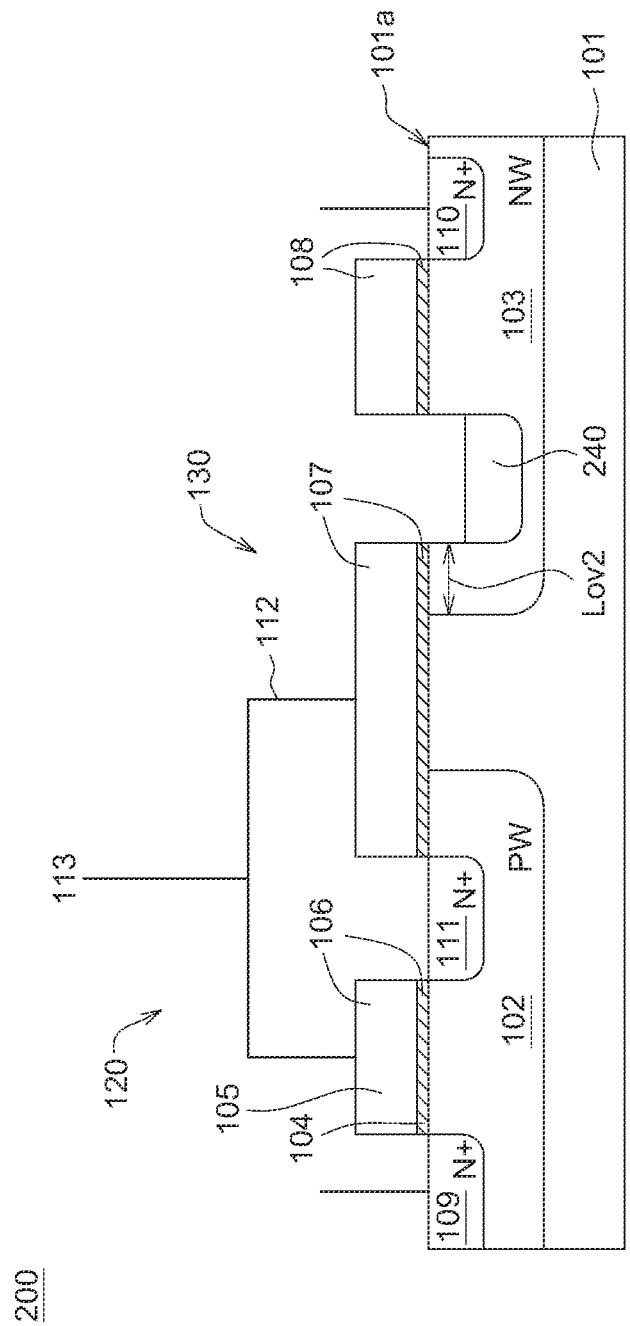
FIG. 2 is a cross-sectional view illustrating a power semiconductor device according to another embodiment of the present disclosure.

FIG. 2 is a cross-sectional view illustrating a power semiconductor device 200 according to another embodiment of the present disclosure. In the present embodiment, the structure of the power semiconductor device 200 is substantially similar to that of the power semiconductor device 100. The difference is that the power semiconductor device 200 further includes an isolation structure, such as a shallow trench insulator (STI) 240, formed in the n-well region 103 and disposed between the gate structure 107 and the dummy gate structure 108 (or between the gate structure 107 and the drain 111).

Next, a plurality of power semiconductor devices with different gate-to-S/D overlap length (LOV) lov2 are fabricated, according to the structure of the power semiconductor device 200 as described in FIG. 2 of the present disclosure, and the varieties in the driving current (ION), the off current (IOFF) and the maximum substrate current (Isubmax) of these power semiconductor devices 200 are recorded and analyzed. And the recorded data are compared with that of conventional power semiconductor devices that merely include a single n-type MOSFET unit.

Figure 3A:
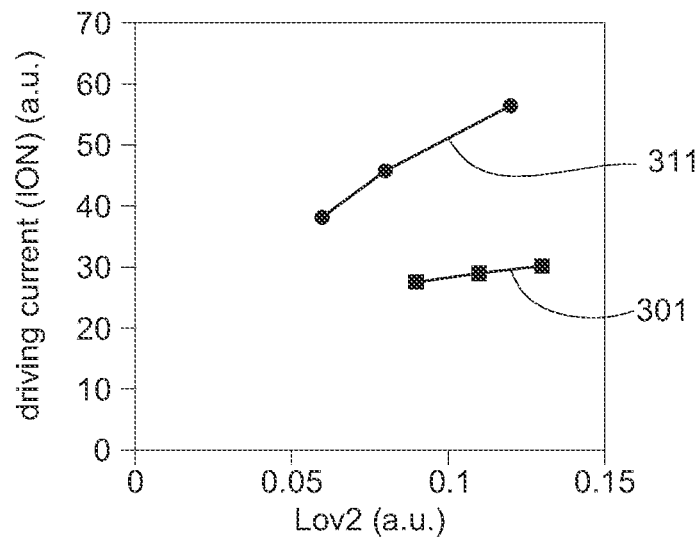
FIG. 3A is a line graph illustrating the relationship between the gate-source/drain overlap length and the driving current (ION) of the power semiconductor devices as depicted in FIG. 2 and that of the power semiconductor devices provided by comparative examples.
Figure 3B:
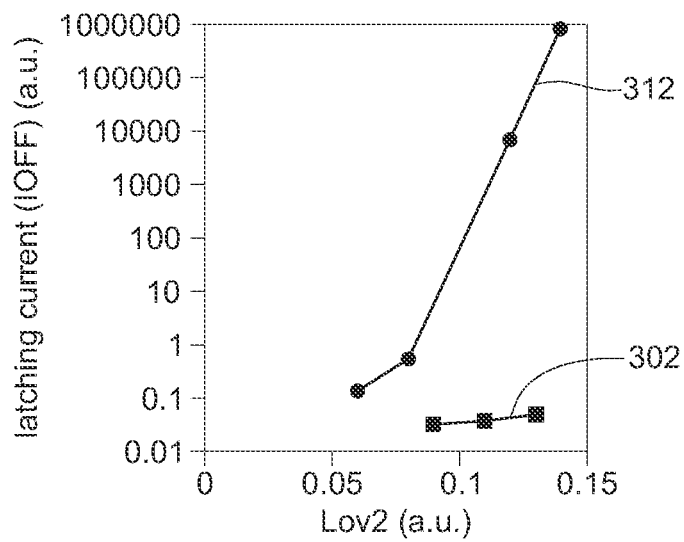
FIG. 3B is a line graph illustrating the relationship between the gate-source/drain overlap length and the latching current (IOFF) of the power semiconductor devices as depicted in FIG. 2 and that of the power semiconductor devices provided by comparative examples.

FIG. 3A is a line graph illustrating the relationship between the gate-source/drain overlap length and the driving current (ION) of the power semiconductor devices 200 as depicted in FIG. 2 and that of the power semiconductor devices provided by comparative examples; FIG. 3B is a line graph illustrating the relationship between the gate-source/drain overlap length and the latching current (IOFF) of the power semiconductor devices 200 as depicted in FIG. 2 and that of the power semiconductor devices provided by comparative examples; and FIG. 3C is a line graph illustrating the relationship between the gate-source/drain overlap length and the maximum substrate current (Isubmax) of the power semiconductor devices 200 as depicted in FIG. 2 and that of the power semiconductor devices provided by comparative examples.

Figure 3C:
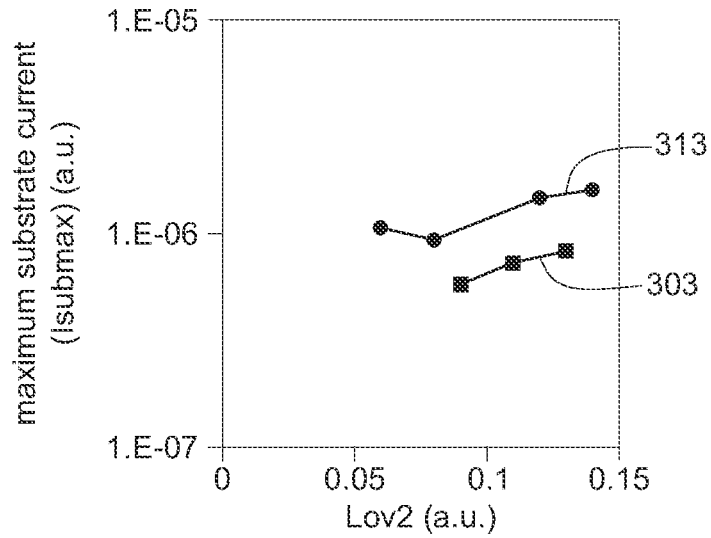
FIG. 3C is a line graph illustrating the relationship between the gate-source/drain overlap length and the maximum substrate current (Isubmax) of the power semiconductor devices as depicted in FIG. 2 and that of the power semiconductor devices provided by comparative examples.

Wherein, the horizontal axis of FIGS. 3A to 3C represents the normalized gate-source/drain overlap length (the unit is au), and the horizontal axis of FIGS. 3A to 3C respectively represents the normalized drive current (ION), off current (IOFF) and maximum Substrate current (Isubmax) (the units are also au). Curves 301, 302 and 303 respectively represent the gate-source/drain overlap length-drive current (ION) relationship curve, the gate-source/drain overlap length-off current (IOFF) relationship curve and the gate-source/drain overlap length-maximum substrate current (Isubmax) relationship curve of the power semiconductor device 200. Curves 311, 312, and 313 respectively represent the gate-source/drain overlap length-drive current (ION) relationship curve, the gate-source/drain overlap length-off current (IOFF) relationship curve and the gate-source/drain overlap length-maximum substrate current (Isubmax) relationship curve of the power semiconductor devices provided by comparative examples.

It can be seen from FIGS. 3A to 3C that under the same gate-source/drain overlap length lov2, the drive current (ION), the off current (IOFF) and maximum substrate current (Isubmax) of the power semiconductor devices 200 is less than that of the power semiconductor devices provided by the comparative examples. It can be determined that, in comparison with the power semiconductor devices provided by the comparative examples, the power semiconductor devices 200 can have a longer gate when the drive current (ION), the off current (IOFF) and maximum substrate current (Isubmax) are kept the same, which means it is less likely to produce hot carrier injection to cause punch through and current leakage, thus the power semiconductor devices 200 may have a higher operating voltage than that of the power semiconductor devices provided by the comparative examples.

In addition, the drive current (ION), the off current (IOFF) and maximum substrate current (Isubmax) of the power semiconductor devices 200 do not fluctuate significantly as the overlap length of the gate-source/drain increases. On the contrary, the drive current (ION), the off current (IOFF) and maximum substrate current (Isubmax) of the power semiconductor devices provided by the comparative examples increase significantly with the increase of the gate-source/drain overlap length. It means that the power semiconductor devices 200 have higher design flexibility and operation reliability than that of the power semiconductor devices provided by the comparative examples.

Figure 4:
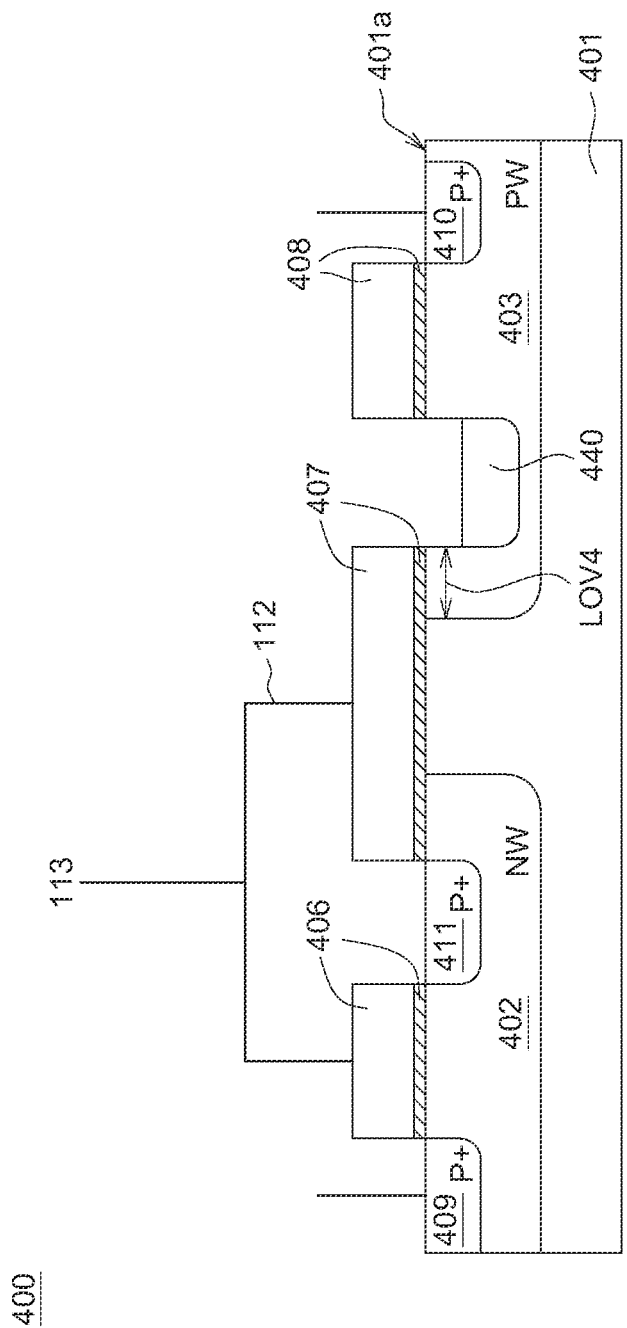
FIG. 4 is a cross-sectional view illustrating a power semiconductor device according to yet another embodiment of the present disclosure.

Although the laterally diffused MOSFET units 120 and 130 involved in the power semiconductor devices 100 and 200, as described in the above embodiments, are both n-type MOSFETs, but the structure of the power semiconductor devices as described in the present disclosure are not limited to this regard. For example, FIG. 4 is a cross-sectional view illustrating a power semiconductor device 400 according to yet another embodiment of the present disclosure. In the present embodiment, the structure of the power semiconductor device 400 is similar that of the power semiconductor device 200, except that the structure of the power semiconductor device 400 includes two p-type MOSFETs.

The power semiconductor device 400 includes a substrate 401, an n-type well region 402, a p-type well region 403, a drain 410, a source 409, a gate structure 406, a gate structure 407, a dummy gate structure 408, and a doping region 411. The substrate 401 has n-type conductivity.

The n-type well region 402 and the p-type well region 403 extend into the substrate 401 from a surface 401a of the substrate 401 and are isolated from each other. The source 409, the drain 410, and the doping region 411 all have p-type conductivities. The drain 410 is disposed in the p-type well region 403; the source electrode 409 is disposed in the n-type well region 402. The gate structure 407 is disposed on the surface 401a of the substrate 401 and at least partially overlaps the n-type well region 402 and the p-type well region 403. The gate structure 406 is disposed on the surface 401a of the substrate 401, overlaps the n-type well region 402, and is isolated from the gate structure 407. The doping region 411 is disposed in the n-type well region 402 and connects the gate structure 406 with the gate structure 407. The dummy gate structure 408 is disposed on the surface 401a of the substrate 401, overlaps the p-type well region 403, and is located between the gate structure 407 and the drain 410. The shallow trench isolation structure 440 is formed in the p-type well region 403 and located between the gate structure 407 and the dummy gate structure 408 (or between the gate structure 407 and the drain 411).

Similarly, a plurality of power semiconductor devices with different gate-to-S/D overlap length (LOV) lov4 are fabricated, according to the structure of the power semiconductor device 400 as described in FIG. 4 of the present disclosure, and the varieties in the driving current (ION), the off current (IOFF) and the maximum substrate current (Isubmax) of these power semiconductor devices 400 are recorded and analyzed. And the recorded data are compared with that of conventional power semiconductor devices that merely include a single p-type MOSFET unit.

Figure 5A:
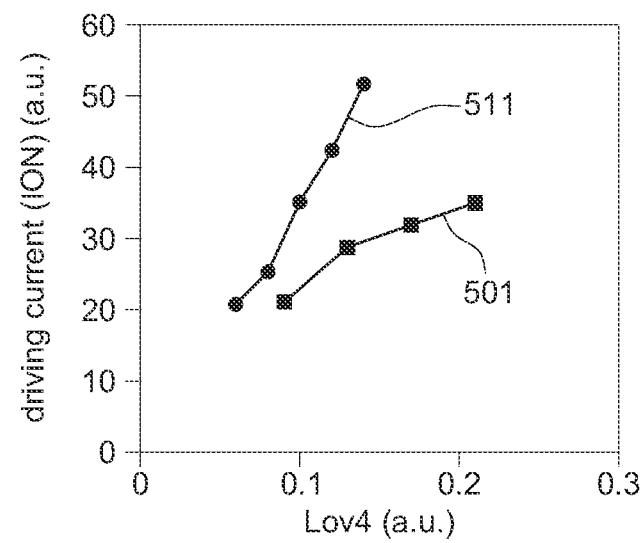
FIG. 5A is a line graph illustrating the relationship between the gate-source/drain overlap length and the driving current (ION) of the power semiconductor devices as depicted in FIG. 4 and that of the power semiconductor devices provided by a comparative example.

FIG. 5A is a line graph illustrating the relationship between the gate-source/drain overlap length and the driving current (ION) of the power semiconductor devices 400 as depicted in FIG. 4 and that of the power semiconductor devices provided by comparative examples; FIG. 3B is a line graph illustrating the relationship between the gate-source/drain overlap length and the latching current (IOFF) of the power semiconductor devices 400 as depicted in FIG. 4 and that of the power semiconductor devices provided by comparative examples; and FIG. 3C is a line graph illustrating the relationship between the gate-source/drain overlap length and the maximum substrate current (Isubmax) of the power semiconductor devices 400 as depicted in FIG. 4 and that of the power semiconductor devices provided by comparative examples.

Figure 5B:
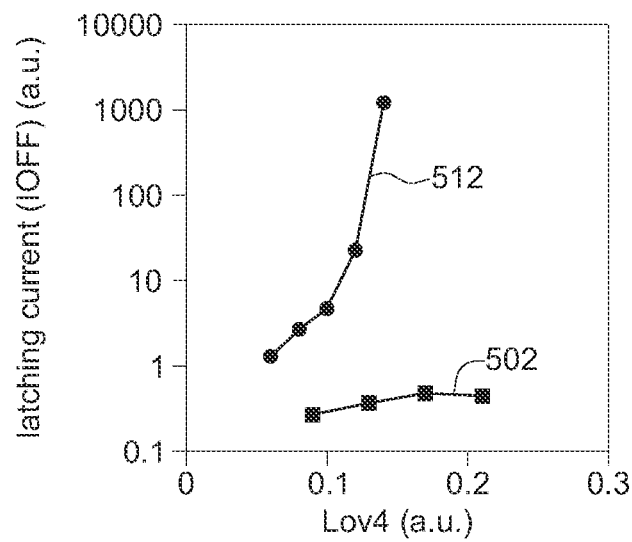
FIG. 5B is a line graph illustrating the relationship between the gate-source/drain overlap length and the latching current (IOFF) of the power semiconductor devices as depicted in FIG. 4 and that of the power semiconductor devices provided by a comparative example.
Figure 5C:
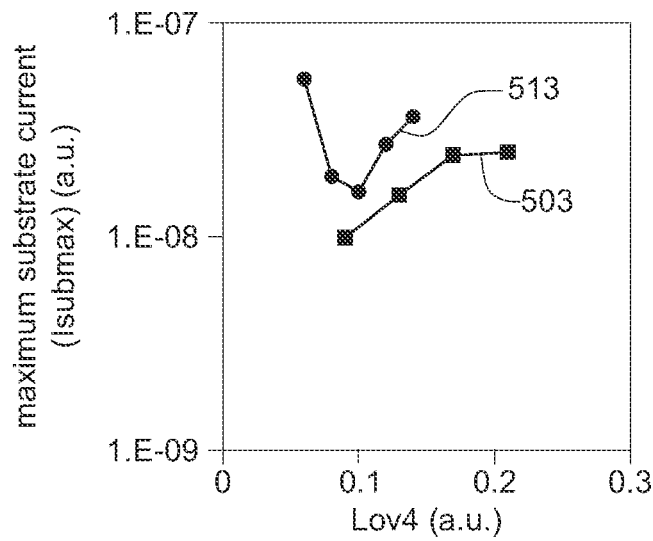
FIG. 5C is a line graph illustrating the relationship between the gate-source/drain overlap length and the maximum substrate current (Isubmax) of the power semiconductor devices as depicted in FIG. 4 and that of the power semiconductor devices provided by a comparative example.

Wherein, the horizontal axis of FIGS. 5A to 5C represents the normalized gate-source/drain overlap length (the unit is au), and the horizontal axis of FIGS. 3A-3C respectively represents the normalized drive current (ION), off current (IOFF) and maximum Substrate current (Isubmax) (the units are also au). Curves 501, 502 and 503 respectively represent the gate-source/drain overlap length-drive current (ION) relationship curve, the gate-source/drain overlap length-off current (IOFF) relationship curve and the gate-source/drain overlap length-maximum substrate current (Isubmax) relationship curve of the power semiconductor device 200. Curves 511, 512, and 513 respectively represent the gate-source/drain overlap length-drive current (ION) relationship curve, the gate-source/drain overlap length-off current (IOFF) relationship curve and the gate-source/drain overlap length-maximum substrate current (Isubmax) relationship curve of the power semiconductor devices provided by comparative examples.

It can be seen from FIGS. 5A to 5C that under the same gate-source/drain overlap length lov4, the drive current (ION), the off current (IOFF) and maximum substrate current (Isubmax) of the power semiconductor devices 400 are less than that of the power semiconductor devices provided by the comparative examples. It can be determined that, in comparison with the power semiconductor devices provided by the comparative examples, the power semiconductor devices 200 can have a longer gate when the drive current (ION), the off current (IOFF) and maximum substrate current (Isubmax) are kept the same, which means it is less likely to produce hot carrier injection to cause punch through and current leakage, thus the power semiconductor devices 400 may have a higher operating voltage than that of the power semiconductor devices provided by the comparative examples.

In addition, the drive current (ION), the off current (IOFF) and maximum substrate current (Isubmax) of the power semiconductor devices 400 do not fluctuate significantly as the overlap length of the gate-source/drain increases. On the contrary, the drive current (ION), the off current (IOFF) and maximum substrate current (Isubmax) of the power semiconductor devices provided by the comparative examples increase significantly with the increase of the gate-source/drain overlap length. It means that the power semiconductor devices 400 have higher design flexibility and operation reliability than that of the power semiconductor devices provided by the comparative examples.

In accordance with the embodiments of the present disclosure, a power semiconductor device including at least two MOSFET devices is provided, in which a first gate structure and a second gate structure separated from each other are formed between the source and the drain and electrically connected together by a doping region. Wherein the doping region has a conductivity identical to that of the source and drain, so that the first gate structure, the source and drain are combined to form a first transistor unit; and the second gate structure, the doping region and the drain are combined to form a second transistor unit, which is connected in series with the first transistor unit. With this design, the operating voltage and reliability of the power semiconductor device can be improved without excessively extending the gate length of the first gate structure and the second gate structure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A power semiconductor device, comprising:
    Substrate, having a surface;
    a first well region, having a first conductivity and extending into the substrate from the surface;
    a second well region, having a second conductivity and extending into the substrate from the surface
    a drain, having the first conductivity and disposed in the first well region;
    a source, having the first conductivity and disposed in the second well region;
    a first gate structure, disposed on the surface and at least partially overlapping with the first well region and the second well region;
    a second gate structure, disposed on the surface and overlapping with the second well region; and
    a doping region, having the first conductivity, disposed in the second well region and connecting the first gate structure with the second gate structure; wherein the first well region is separated from the second well region.

2. The power semiconductor device according to claim 1, further comprising an isolation structure formed in the first well region and disposed between the first gate structure and the drain.

3. The power semiconductor device according to claim 2, wherein the isolation structure is a shallow trench insulator (STI).

4. The power semiconductor device according to claim 1, further comprising a dummy gate structure disposed between the first gate structure and the drain.

5. The power semiconductor device according to claim 4, wherein the dummy gate structure is adjacent to the drain and isolated from the first gate structure.

6. The power semiconductor device according to claim 1, wherein the first conductivity is n-type conductivity, and the second conductivity is p-type conductivity.

7. The power semiconductor device according to claim 1, wherein the first conductivity is p-type conductivity and the second conductivity is n-type conductivity.

8. The power semiconductor device according to claim 1, wherein the first gate structure and the second gate structure are connected to a common voltage source.

9. The power semiconductor device according to claim 1, wherein the first gate structure is isolated from the second gate structure.

* * * * *